US006922682B1

(12) United States Patent
Shum et al.

(10) Patent No.: US 6,922,682 B1
(45) Date of Patent: Jul. 26, 2005

(54) METHOD AND SYSTEM FOR ENGINEERING DISCOVERY

(75) Inventors: Martin Shum, Camarillo, CA (US); Gregg Fialcowitz, Northridge, CA (US); Neven Karlovac, Pacific Palisades, CA (US); Narashimhan Kishore Mandeyam, Glendale, CA (US); Larry Yen, South Pasadena, CA (US); Ravi Sajwan, Saratoga, CA (US)

(73) Assignee: Aprisa, Inc., Westlake Village, CA (US)

( * ) Notice: Subject to any disclaimer, the term of this patent is extended or adjusted under 35 U.S.C. 154(b) by 664 days.

(21) Appl. No.: 09/689,248

(22) Filed: Oct. 11, 2000

Related U.S. Application Data

(60) Provisional application No. 60/239,617, filed on Oct. 11, 2000, provisional application No. 60/167,630, filed on Nov. 26, 1999, provisional application No. 60/158,962, filed on Oct. 12, 1999, provisional application No. 60/158,428, filed on Oct. 12, 1999, provisional application No. 60/158,440, filed on Oct. 12, 1999, provisional application No. 60/158,963, filed on Oct. 12, 1999, provisional application No. 60/158,439, filed on Oct. 12, 1999, provisional application No. 60/158,429, filed on Oct. 12, 1999, provisional application No. 60/158,431, filed on Oct. 12, 1999, provisional application No. 60/158,430, filed on Oct. 12, 1999, and provisional application No. 60/158,438, filed on Oct. 12, 1999.

(51) Int. Cl.[7] .............................................. G06F 15/18
(52) U.S. Cl. ....................................................... 706/47
(58) Field of Search .......................... 706/47; 707/104.1

(56) References Cited

U.S. PATENT DOCUMENTS

| 5,295,261 A | | 3/1994 | Simonetti ....................... 707/2 |
|---|---|---|---|
| 5,555,345 A | | 9/1996 | Komori et al. ................ 706/25 |
| 5,619,621 A | * | 4/1997 | Puckett .......................... 706/47 |
| 5,808,613 A | | 9/1998 | Marrin et al. ................ 345/850 |
| 5,822,206 A | * | 10/1998 | Sebastian et al. .............. 700/97 |
| 5,889,951 A | | 3/1999 | Lombardi ..................... 709/219 |
| 5,923,330 A | | 7/1999 | Tarlton et al. ............... 345/419 |
| 5,935,210 A | | 8/1999 | Stark ............................ 709/224 |
| 5,987,469 A | | 11/1999 | Lewis et al. ................. 707/102 |
| 6,005,504 A | | 12/1999 | Hirono ......................... 341/83 |
| 6,035,330 A | | 3/2000 | Astiz et al. ................... 709/218 |
| 6,069,632 A | | 5/2000 | Mullaly et al. .............. 345/419 |
| 6,070,176 A | | 5/2000 | Downs et al. ............... 707/513 |
| 6,073,115 A | | 6/2000 | Marshall ....................... 705/35 |
| 6,144,962 A | | 11/2000 | Weinberg et al. ............. 707/10 |
| 6,604,114 B1 | * | 8/2003 | Toong et al. ............. 707/104.1 |

OTHER PUBLICATIONS

Subpicometer accuracy laser wavelength sensor using multiplexed Bragg gratings Feng Zhao; Sayano, K.; Miller, H.E.; Karlovac, N.; Photonics Technology Letters, IEEE , vol.: 9, Issue: 11 , Nov. 1997 pp.: 1493–1495.*

(Continued)

*Primary Examiner*—Anthony Knight
*Assistant Examiner*—Michael B. Holmes
(74) *Attorney, Agent, or Firm*—Oppenheimer Wolff & Donnelly LLP

(57) ABSTRACT

A method and system for engineering discovery. A block diagram of a system can be further refined by building a basic search query listing the functional requirements for block. The search query can be expanded by selecting one or more saved rules. A database can return components or subsystems that meet the criteria from the basic search query or the expanded search query. One or more candidates can be chosen from the answer set and assigned to the block. A system-constraint-based selection can compare combinations of the candidate components against a set of predefined criteria to indicate the components to be used for the system which meet those criteria. The design of the system can be accomplished by using generic descriptions rather than blocks.

19 Claims, 11 Drawing Sheets

OTHER PUBLICATIONS

Wavelength–stabilized Laser Source For Dense Wavelength–division Multiplexing Hendow, S.T.; Miller, H.E.; Sayano, K.; Karlovac, N.; Lasers and Electro–Optics, CLEO '97., Summaries of Papers Presented at the Conference on, vol.: 11 , pp.: 27–28.*

Keith Andrews, Josef Wolte, and Michael Pichler, Information Pyramids™: A New Approach to Visualising Large Hierarchies, *Late Breaking Hot Topics Proc., IEEE Visualization '97*, Phoenix, AZ, Oct. 1997, pp. 49–52.

Mark Bruls, Kees Huizing, and Jarke J. van Wijk, Squarified Treemaps, *Eindhoven University of Technology, Dept. of Mathematics and Computer Sciences*, The Netherlands.

Ben Schneiderman, Treemaps for space–constrained visualization of hierarchies, *Human–Computer Interaction Lab, University of Maryland*, Dec. 26, 1998, updated Apr. 17, 2000.

* cited by examiner

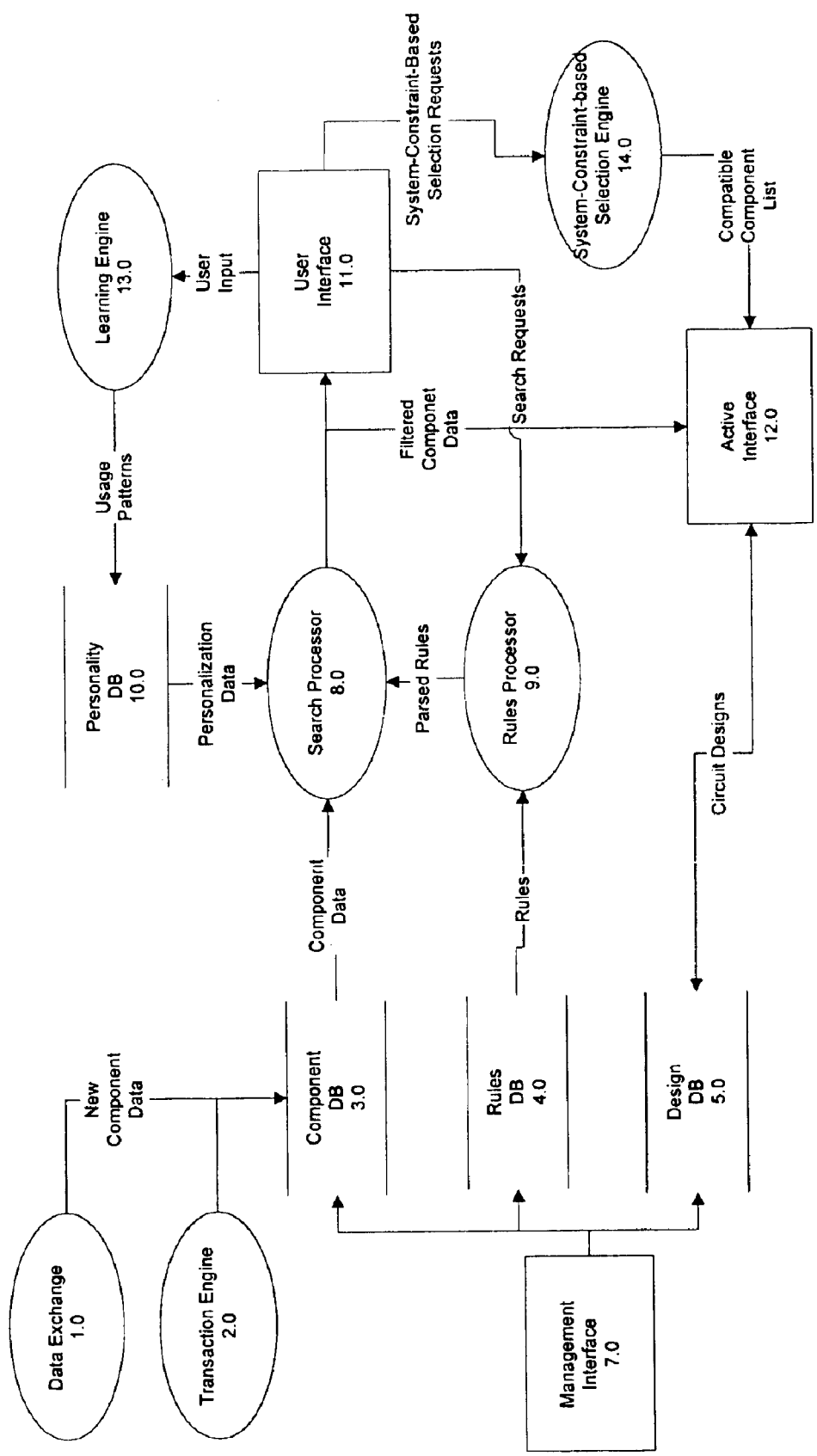
Figure 5A: Main 0.0

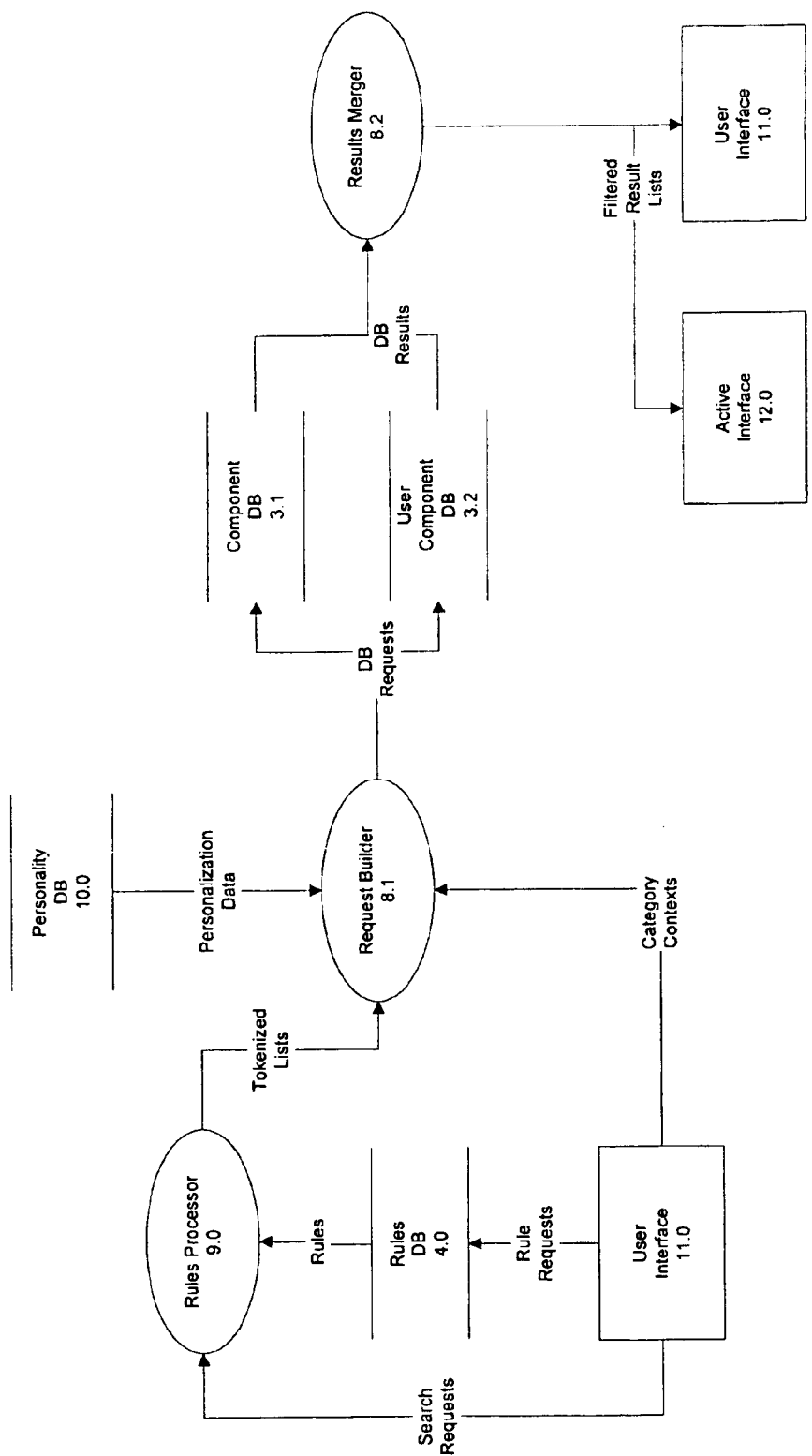
Figure 5B: Search Processor 8.0 & Component DB 3.0

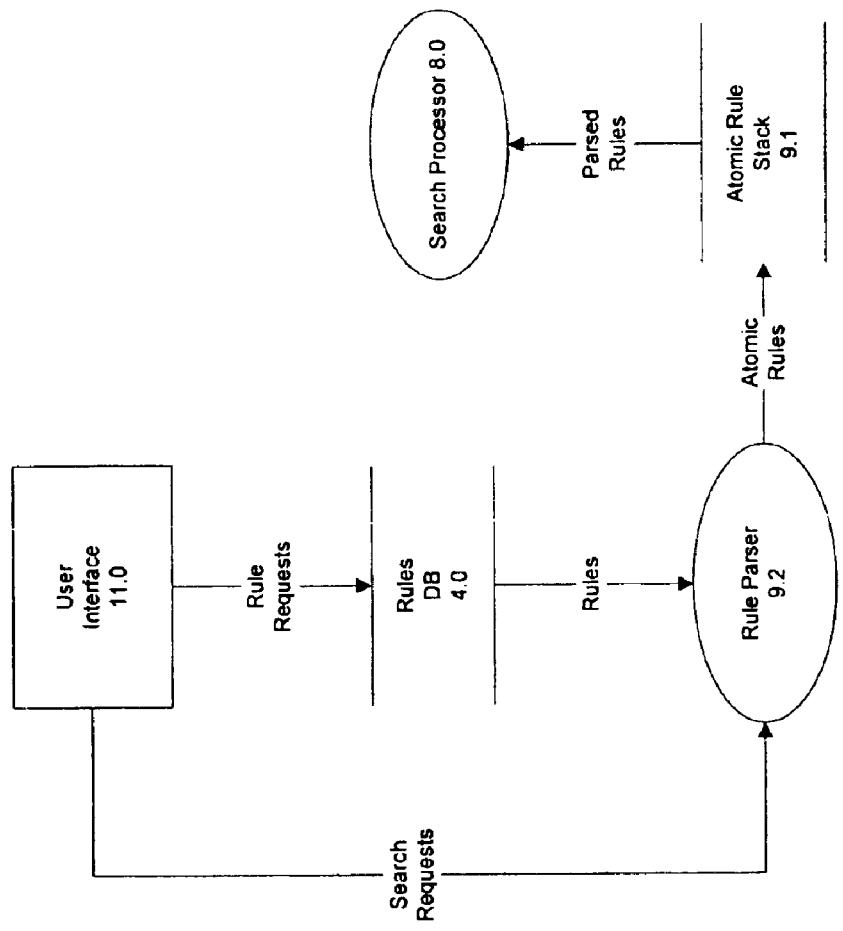
Figure 5C: Rules Processor 9.0

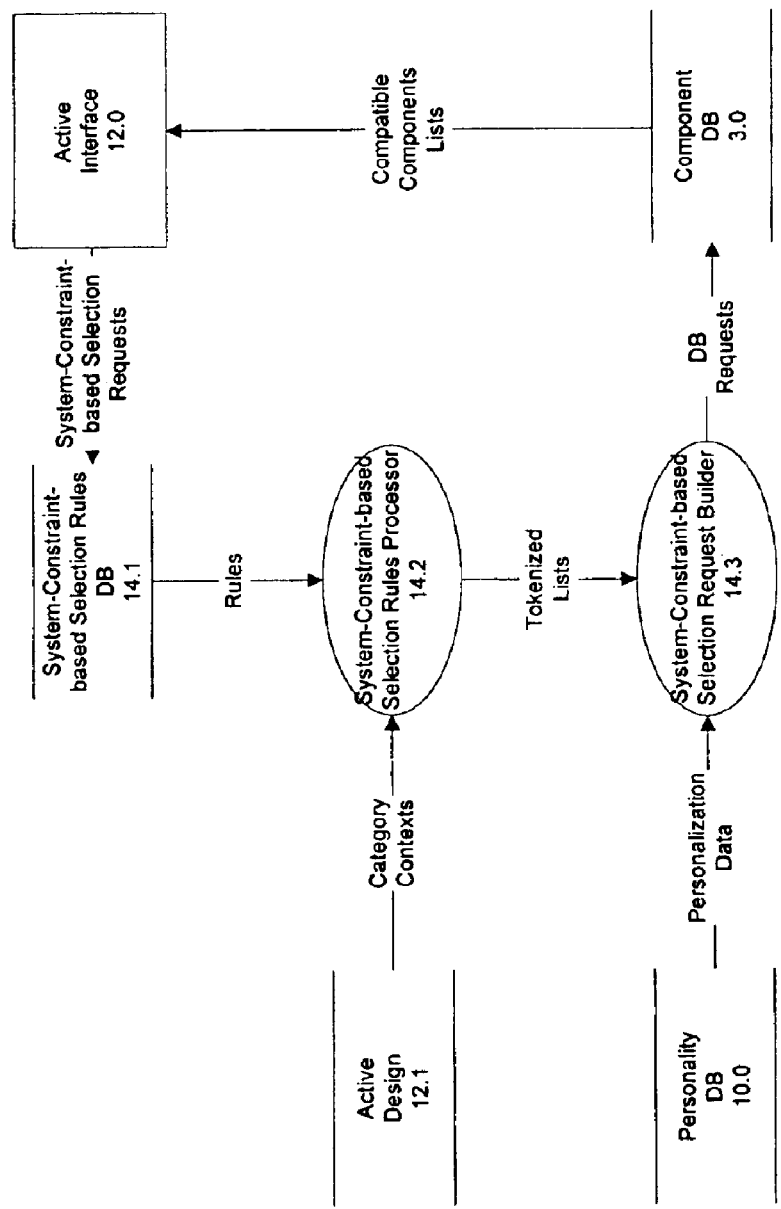
Figure 5D: System-Constraint-based Selection Engine 14.0

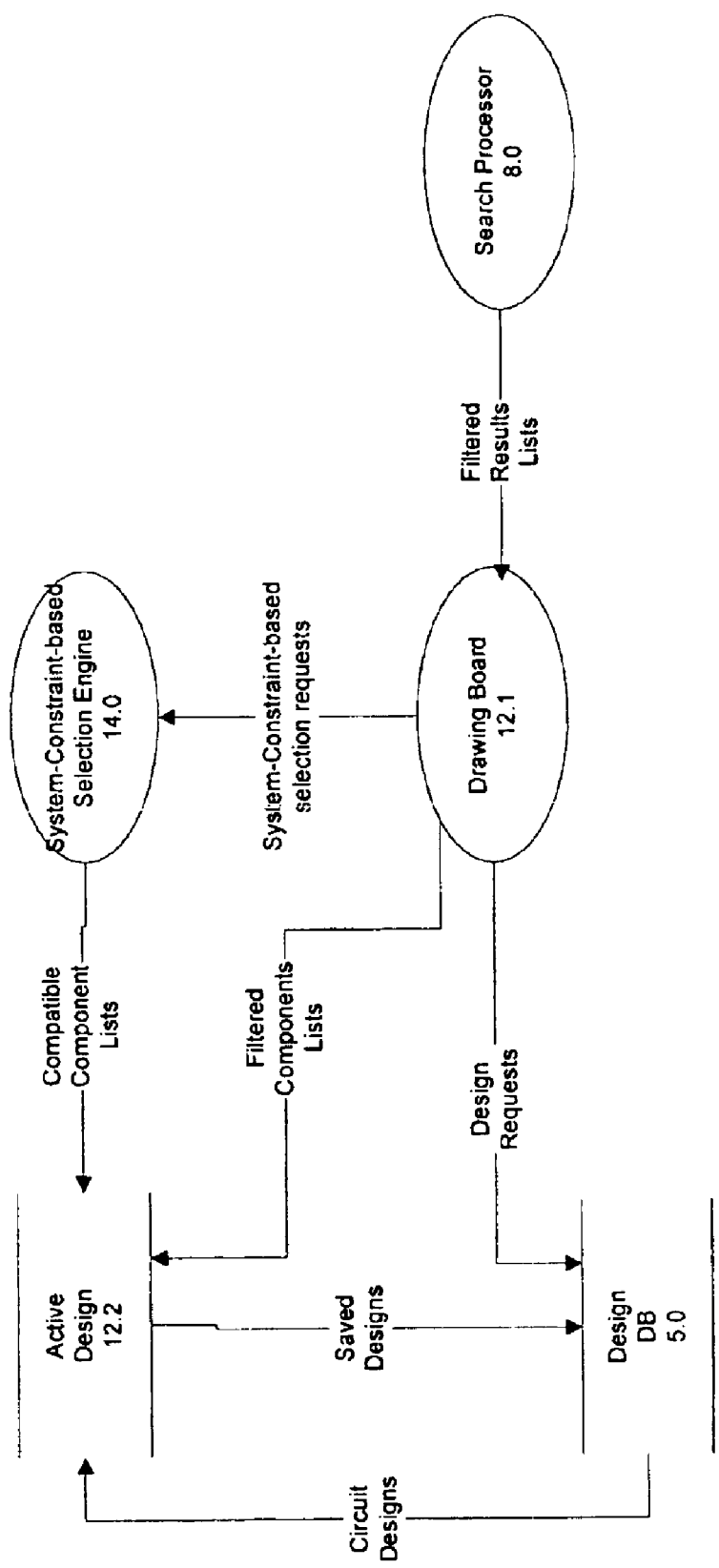
Figure 5E: Active Interface 12.0

METHOD AND SYSTEM FOR ENGINEERING DISCOVERY

CROSS-REFERENCE TO RELATED APPLICATIONS

This application claims the benefit of the following:

U.S. Provisional Application No. 60/158,962, filed on Oct. 12, 1999, entitled "Method for Building an Accreted Database and User-Defined Database Rules";

U.S. Provisional Application No. 60/158,428, filed on Oct. 12, 1999, entitled "Application of Accretive Knowledge Base to Engineering Discovery";

U.S. Provisional Application No. 60/158,440, filed on Oct. 12, 1999, entitled "Creation of Objects from Rules";

U.S. Provisional Application No. 60/158,963, filed on Oct. 12, 1999, entitled "Generic Method and System for Modeling Objects";

U.S. Provisional Application No. 60/158,439, filed on Oct. 12, 1999, entitled "Rendering Object Hierarchy and Object Relationships into Block Diagrams";

U.S. Provisional Application No. 60/158.429, filed on Oct. 12, 1999, entitled "Retention of Search Engine Rules for Individual Users";

U.S. Provisional Application No. 60/158,431, filed on Oct. 12, 1999, entitled "Method and System for Establishing Relationships, Constraints, and Rules Among Objects";

U.S. Provisional Application No. 60/158,430, filed on Oct. 12, 1999, entitled "Method and Search Engine for the Extraction and Retrieval of Tiered, Logical and Relational Information from a Plurality of Sources";

U.S. Provisional Application No. 60/158,438, filed on Oct. 12, 1999, entitled "Method and Computer Program for Tokenizing Rules and Search Engine Queries";

U.S. Provisional Application No. 60/167,630, filed on Nov. 26, 1999, entitled "Tool for Discovery and Heuristic System Design"; and U.S. Provisional Application No. 60/239,617, filed on Oct. 11, 2000, entitled "CircuitNet: A Tool for Discovery and Heuristic System Design."

The contents of these provisional applications are incorporated herein by reference.

BACKGROUND OF THE INVENTION

The present invention relates to computer-aided design and particularly to a computerized discovery tool for electrical engineers.

According to industry sources, the high-tech industry is projected to grow from approximately $610 billion in 1999 to approximately $1.1 trillion in 2004. While the high-tech market is growing rapidly, it is also undergoing rapid change. Although this industry has typically been characterized by complex products, volatile product life cycles and frequent product obsolescence, rapid developments in technology have magnified these characteristics. As a result, high-tech companies face increasing pressure to accelerate the development and delivery of increasingly complex products to remain competitive in their industry. Additionally, manufacturers, suppliers and distributors of technology and component parts are under comparable competitive pressure to quickly and efficiently adjust their inventory to meet the changing product development needs of their high-tech customers.

The high-tech research and development process is highly complex and consists of three logical phases—Discovery, Design and Implementation. The most crucial phase is the Discovery phase because it provides the foundation for a product's development and, if incomplete, may result in a product that is non-competitive or unprofitable, has a short life cycle or violates others' intellectual property. Rather than a linear process, the Discovery phase is an extensive, iterative and organic process, frequently requiring a collaborative, as opposed to an individual, effort. During the Discovery phase, engineers conceptualize an idea, break it down into manageable elements, identify a finite set of possible solutions for each element, test each solution against predefined performance criteria and finally select the optimal solution, while ensuring the interdependencies between each element remains intact. In one method too accomplish this, engineers: (1) create a block diagram of their concept; (2) research vast amounts of specialized information such as algorithms and standards from leading research institutions and industry forums; (3) verify the product concept against protected art to ensure uniqueness; (4) consider the optimal hardware architecture and components to implement the design; (5) investigate available firmware and software from third-party developers to determine "make or buy" decisions; and (6) repeat these steps for each block in their diagram, as many times as necessary to select the optimal component or subsystem for each block, while ensuring the interdependencies between each block remain intact.

For the Discovery process to be effective, engineers need to know what is available from all possible sources as well as what is currently in development. Traditional resources for high-tech Discovery are currently highly fragmented and decentralized, ranging from publications from research institutions, universities, standards forums, patent offices and trade journals to consultations with patent attorneys, field applications engineers and manufacturers' representatives.

Each of these sources suffers from limitations. Some publications do not contain up-to-date information and other sources of information are frequently biased because they contain data only on certain manufacturers' or distributors' products. Still others, such as dissertations or information available only by executing non-disclosure agreements ("NDAs"), are not easily accessible or, in the case of patents, understandable to engineers because they are drafted by lawyers who use their own specialized language. Similarly, consultations are typically incomplete because the knowledge or bias of the consultant limit them.

As a result, Discovery undertaken using traditional resources is costly, inefficient, time consuming, incomplete and prone to error. Moreover, the iterative nature of Discovery exacerbates these shortcomings, making it increasingly difficult for companies using traditional Discovery methods to keep pace with shorter product life cycles and higher growth expectations within the high-tech industry.

Although high-tech companies are increasingly utilizing the Internet to address their research and development needs, there are no interactive Discovery tools available on the Internet today. Furthermore, the Web sites that are available address only certain portions of the Discovery process. As a result, engineers at high-tech companies must still utilize costly, time-consuming and error-prone resource channels, making it difficult to accelerate the development and delivery of new products and to remain competitive. Furthermore, the Web sites currently available to design engineers suffer from the same limitations as the traditional channels for one or more of the following reasons:

(1) The available tools are rudimentary

The tools that currently exist on the Web are not robust. Because they are quite limited in functionally, engineers must still undertake a fragmented, time-consuming, costly and error-prone Discovery process, which can delay time-to-market of the product under development.

(2) Narrow, isolated databases

During the Discovery process, engineers need to access a broad range of interdependent information. Currently, however, the databases available to the engineering community on-line are typically limited to a particular category of information and do not in the aggregate provide all the information necessary to support the Discovery process. As a result, engineers must navigate between Web sites and consult traditional resources, making it time consuming and difficult for them to identify the optimal solutions.

(3) Incomplete or biased databases

Currently, many of the databases available to the engineering community are incomplete or biased. The few electronic component databases that do exist lack up-to-date information that is generally available only under non-disclosure agreements. Furthermore, some of the databases are primarily fulfillment driven and are biased by only providing information on the products being offered. As a result, engineers must still consult traditional and on-line resources in each category, thereby prolonging the Discovery process.

(4) Improperly structured information

Technology such as algorithms, electronic components and software code can typically be used in multiple applications, yet the few engineering-related databases available on the Internet today lack functionality necessary to enable engineers to search effectively. For example, most of the component databases have been structured according to part number, pricing information and other attributes targeted primarily for procurement-these characteristics are not very useful for engineers. As a result, engineers must still undertake time-consuming searches off-line to complete an effective Discovery process.

(5) Unsophisticated search capabilities

Currently, Web sites that offer engineering-related databases typically use keyword or parametric search engines that are primarily text-based and therefore do not allow engineers to search according to their functional requirements. Such keyword searches do not enable engineers to discover interdependent information within subsets or supersets. As a result, searches on these Web sites are frequently ineffective and time consuming.

What is needed in the art is a better method and system for Engineering Discovery that will provide a systematic approach to Discovery. Such a system should provide engineers with a complete system, including more robust databases, better searching techniques, and other tools which make the Discovery process quicker, more accurate, and easier.

SUMMARY OF THE INVENTION

This invention can be regarded as a computerized discovery tool for engineers. In one embodiment of the invention, the tool allows engineers to design a system as a block diagram made up of a series of interconnected blocks. The tool assists the engineer in refining the blocks by finding components or subsystems that are the best choices for the blocks based on a set of criteria. In one embodiment, a first block is selected and a search query is built for finding which components or subsystems can be used for the first block. An answer set is received satisfying the search request. At least one component or subsystem from the answer set can be assigned as a candidate object for the first block. In some embodiments, if a single component is chosen, the block diagram can be updated by replacing the first block with a representation of the component or subsystem. In some embodiments, all of the blocks of the block diagram are refined in this matter.

In another embodiment of the invention, the design of the system is by some method other than with block diagrams. In such a design, what would be a block in a block design, is a generic description of the component or subsystem. In this embodiment, the invention assists with determining the available components or subsystems that can be used in place of the generic descriptions.

Embodiments of the invention can be used with databases other than those storing information of components and subsystems. Other embodiments of the invention are directed to technical papers, patent documents, or software modules, etc.

BRIEF DESCRIPTION OF THE DRAWINGS

FIGS. 5A through 5E are dataflow diagrams of one embodiment of a computerized discovery tool in accordance with the invention.

DETAILED DESCRIPTION OF PREFERRED EMBODIMENTS OF THE INVENTION

Figure 1:
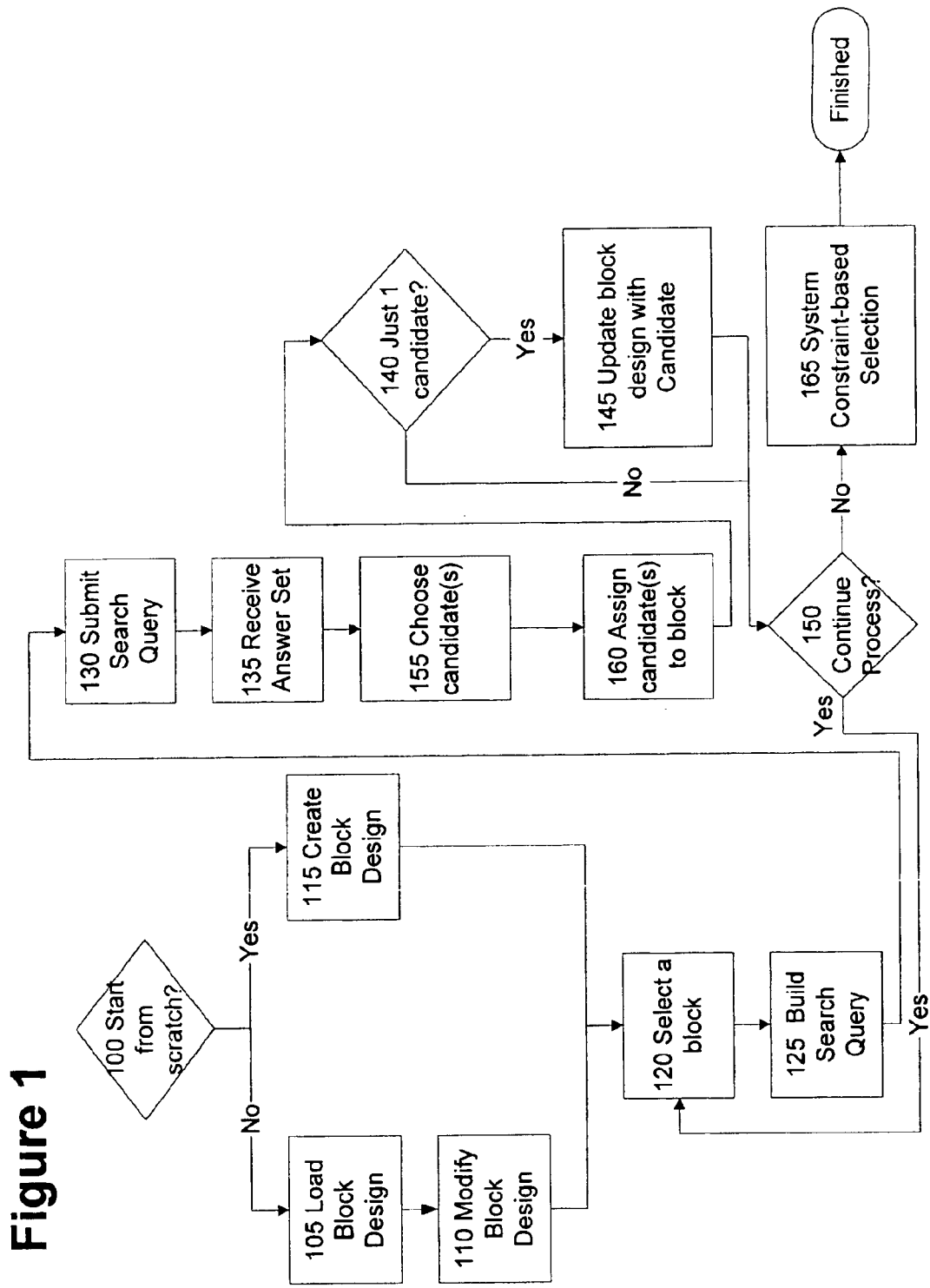
FIG. 1 is flow chart diagram of one embodiment of a method of performing discovery in accordance with the invention.

The present invention is a method and a computerized discovery design tool for engineers. Throughout the drawings, an attempt has been made to label corresponding elements with the same reference numbers. The reference numbers include:

| Reference Number | Description |
| --- | --- |
| 100 through 165 | Steps in FIG. 1's Flowchart |
| 200 | Discovery tool |
| 205 | Transaction Engine |
| 210 | Data exchange |

-continued

Figure 4:
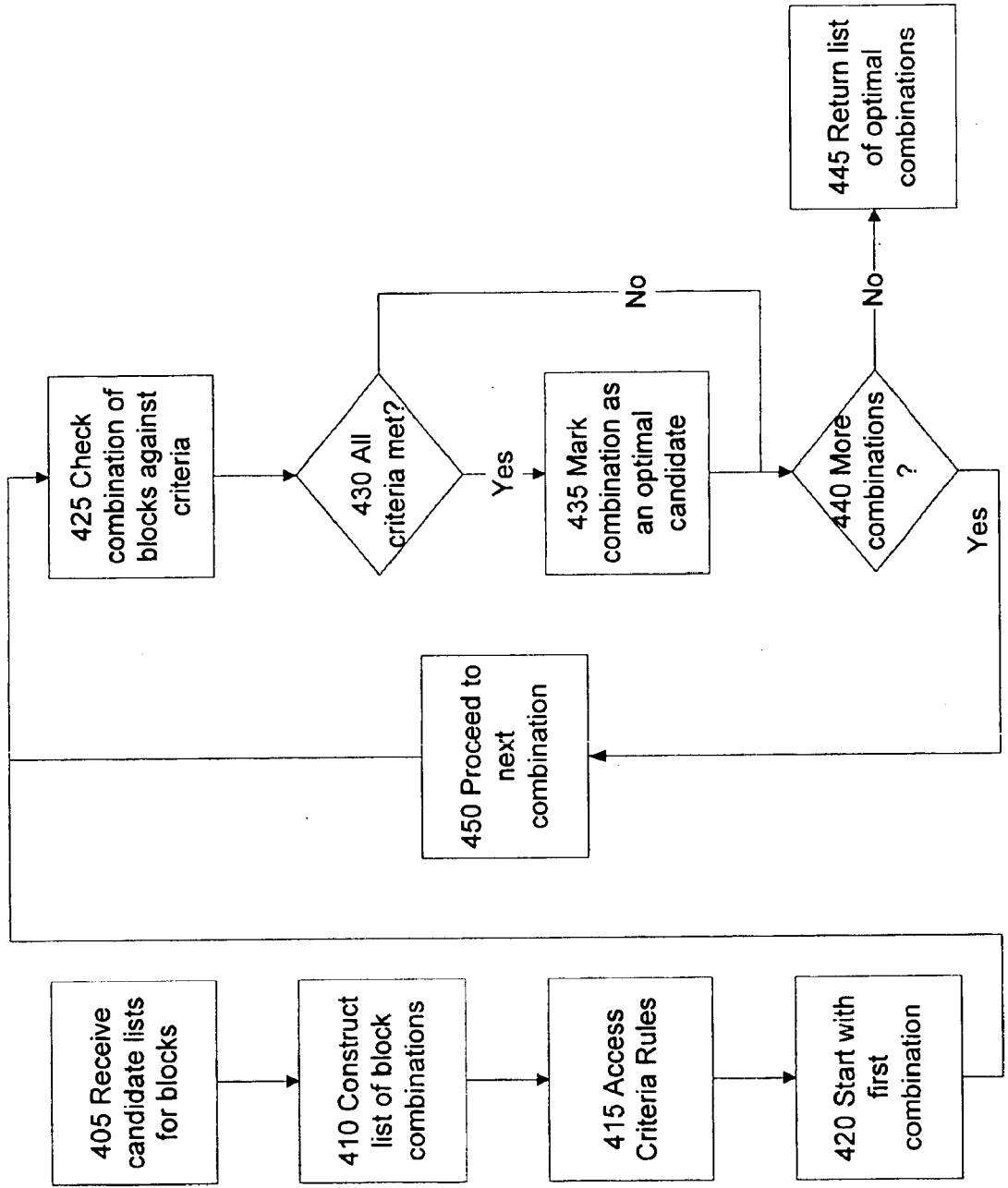
FIG. 4 is a flow chart diagram of one embodiment of system-constraint-based selection method in accordance with the invention.
Figure 7:
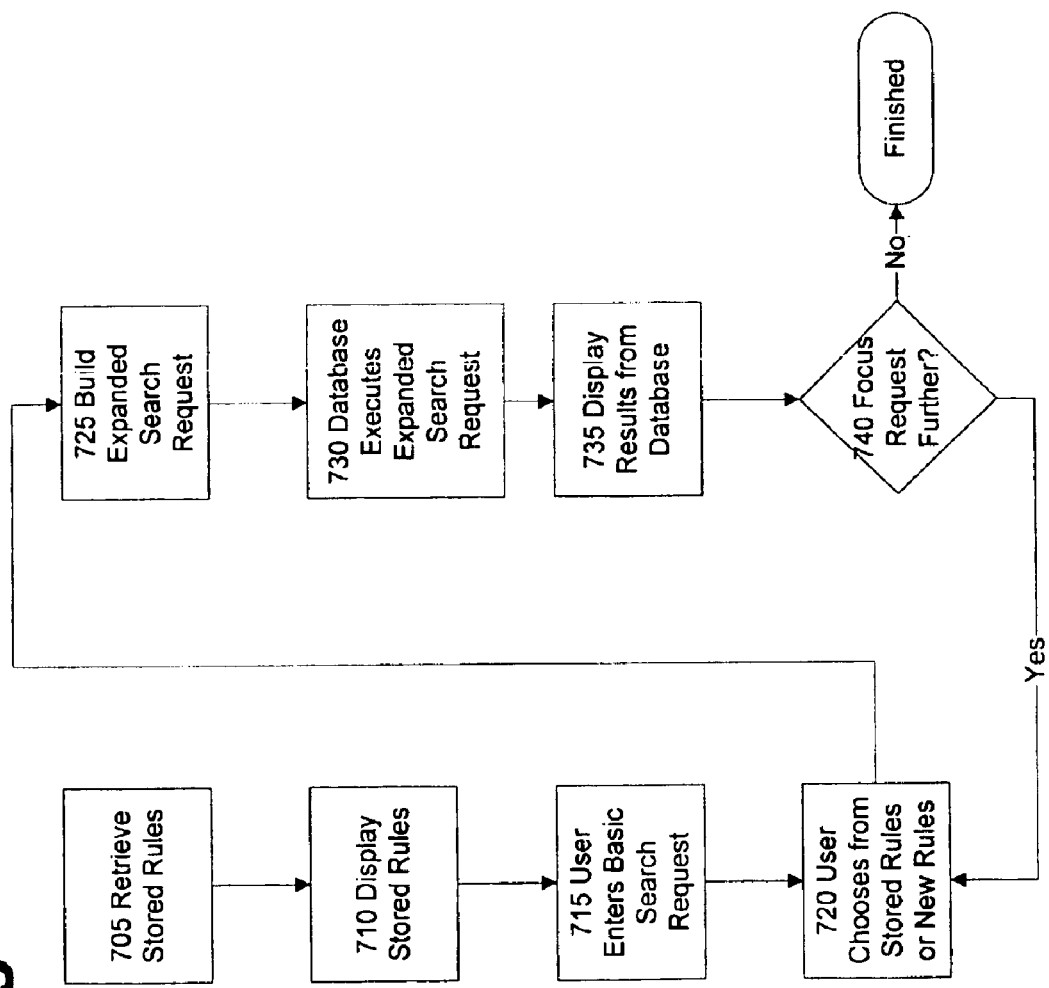
FIG. 7 is a flow chart diagram of one embodiment of a method for combining rules with a search request, in accordance with the invention.

| Reference Number | Description |
| --- | --- |
| 215 | Search Database |
| 220 | Rules Database |
| 225 | Search Processor |
| 230 | Rules Processor |
| 235 | Account Database |
| 240 | Personality Database |
| 245 | Learning Engine |
| 250 | User Interface |
| 255 | Active Interface |
| 260 | System-Constraint-based Selection Engine |
| 265 | Management Interface |
| 305 | CPU |
| 310 | Memory |
| 315 | Clock |
| 320 | Candidates for CPU Component |
| 325 | Candidates for Memory Component |
| 330 | Candidates for Clock Component |
| 405 through 450 | Steps in FIG. 4's flowchart |
| 605 | |
| 610 | Proxy Server |
| 615 | Server |
| 620 | Cluster Server |
| 625 | Objects & Processors |
| 630 | Ad Server |
| 635 | Index Server |
| 640 | Site Server Commerce Edition |
| 645 | Databases |
| 650 | File Server |
| 705 through 740 | Steps in FIG. 7's flowchart |

With respect to Discovery undertaken by engineers, the present invention's method can assist the engineers in conceptualizing system designs by a heuristic approach. In other words, by following the described method, engineers can take a conceptualized idea which has been broken down into elements, identify a set of possible solutions for each of those elements, test each possible solution against predefined performance criteria, and finally select the optimal solution, all the while ensuring that the interdependencies among the elements remain intact. The present invention also is a software system which automates this method, making Discovery more efficient and easier to accomplish.

As described above, Discovery is the first of three logical phases that are followed by an engineer during research and development for a new product. The remaining two phases are Design and Implementation. FIG. 1 shows one embodiment of the present invention's method for performing such discovery. This method is automated with a computer system having a database of component information and the functionality to graphically construct block diagrams.

Referring to FIG. 1, an engineer can either begin Discovery from scratch (without any block diagram design), or the engineer can base the conceptual design on a previously generated and saved block diagram design (Steps 100, 105, 110, and 115). Regardless of the approach used, in some fashion, the engineer obtains a block diagram of the system. The block diagram is made up of a series of interconnected blocks. Each of these blocks represents a component or subsystem (since systems are often hierarchical, containing various levels of subsystems and components). Throughout this application, the use of "component" refers not only to true components, but also includes subsystems. Also, throughout this application, although a system is often referred to as a series of interconnected blocks in a block diagram, other methods of describing the system are also encompassed by the present invention. Thus, a system can be described as a series of inter-related generic descriptions, where each generic description represents a component or subsystem, like a block does in a block diagram.

One of the primary goals of the Discovery phase is for the engineer to create a conceptual design of a product which can then be used in the Design phase to create manufacturable specifications. In Discovery, an engineer refines a design of a system by researching each of the design's components to come up with a near-optimal solution of the exact components that should be used. The near-optimal solution is based on the compatibility of the various components as well as various predefined criteria. Choosing which element to use for each component of a design is very difficult because there are numerous factors to take into account. Price and availability are two such factors. Compatibility with the rest of the components to be placed in the design is another factor. Due to the number of manufacturers for any given category of product, and because all of these manufacturers are continually introducing new and improved products, an engineer is challenged with an ever increasing amount of information to consider during Discovery.

With the present invention's method, an engineer breaks the discovery process into iterative steps. The engineer chooses one of the blocks from the block diagram for current research (step 120). To retrieve all components which can be used to implement this block, the engineer constructs a search query which includes the necessary limitations. Suppose the a engineer is designing a simple computer system made up of a CPU, a memory, and a clock. For various reasons, the engineer may determine that the CPU must operate at least at a speed of 400 megahertz. Because of business restrictions, the engineer may be prevented from utilizing any components manufactured by a certain corporation ("XYZ Corp." for example). The CPU may need to be PC compatible and have an operating voltage of between 2.2 and 3.3 volts. From these limitations, the engineer can build a series of search query rules, such as:

Clock-speed >400
AND Manufacturer!="XYZ"
AND
Compatibility="PC"
AND
Voltage BETWEEN (2.2,3.3).

Furthermore, the engineer may be faced with a limitation which depends on one of the component's own attributes, or upon an attribute of an earlier portion of the design. For example, perhaps there is a requirement that the price for the CPU component must be less than $10, unless the CPU component is of military grade. For military grade goods, the engineer is allowed to incorporate CPUs that cost up to $25. With this additional requirement, the engineer can expand the search query rules to be:

IF
Military-Grade MH (yes)
THEN
Clock-Speed>400
AND
Manufacturer!="XYZ"
AND
Compatibility="PC"
AND
Voltage BETWEEN (2.2,3.3)
AND
Cost<25.00
ELSE
Clock-Speed>400

AND
Manufacturer!="XYZ"
AND
Compatibility="PC"
AND
Voltage BETWEEN (2.2,3.3)
AND
Cost<10.00
END (The MH( ) function is used to indicate that an attribute must have a specified value.)

Once the search query rules are constructed in step 125, the computer system parses the rules, may apply additional user-based or system-based rules, and then executes the query against the component database (step 130). In step 135, an answer set of components meeting all of the query's requirements is returned to the system from the database and passed along to the engineer.

In one embodiment, the user can save many rule individual rules. When building an individual search request, the system presents to the user a list of all of the saved rules. The user can indicate which (if any) of these rules should be applied to the search request. The search request is then expanded to include the selected saved-rules. This is extremely useful because often an engineer will be faced with requirements that will carry over into most of an entire system. The saved-rules functionality allows the user to quickly include such requirements in his or her searches without having to type the requirement for each search.

For example, perhaps the user has saved the following rules:

Rule 1: Voltage BETWEEN (2.2,3.3)
Rule 2: Manufacturer="Intel"
Rule 3: Manufacturer!="XYZ"
Rule 4: Compatibility="PC"
Rule 5: Availability="Immediate"

With these rules saved, to building the previous search request because simpler. Now the search request is:

IF
Military-Grade MH (yes)
THEN
Clock-speed>400
AND
Cost<25.00
ELSE
Clock-speed>400
AND
Cost<10.00
END Before the search request is executed, the user is presented with a list of the five saved rules. The user can then indicate, such as by selecting checkboxes, Rules 1, 3, and 4. When a user is faced with a protracted Discovery process of anywhere from weeks to months, the use of such saved rules during the many search requests becomes very useful. FIG. 7 shows a flow chart of one embodiment of this type of searching functionality. In FIG. 7, the discovery tool 200 retrieves a set of stored rules at step 705. These rules may be specific to a user, may be available to all users system-wide, or may be a combination of these. The stored rules are displayed to the user at step 710. In one embodiment, the rules-are presented in a dialog box in text form, each rule preceded by a checkbox. At step 715, the user can enter his or her basic search request. (Of course, the basic search request could also be entered prior to the system retrieving and displaying the stored rules). At step 720, the user can choose which stored rules should be also applied to the basic search request, such as by selecting some of the checkboxes. At this step, the user can also set up new stored rules. At step 725, the discovery tool system 200 builds an expanded search request. This expanded search request includes the basic search request as well as the chosen rules. At step 730, the expanded search request is executed on the database of objects 215 and the results are returned to the user at step 735. The user can then either work with these results, or further focus (i.e., refine) the results by applying different rules to the original search request (step 740). This refinement can be done by applying additional rules to the present set of results to further limit them, or if one or more rules are de-selected, or if a new rule is chosen which may require the retrieval of database objects not in the results, then the system may re-execute the expanded search request. For simplicity, the flow chart of FIG. 7 only shows refinement through re-execution of the expanded search request. One skilled in the art can determine how to apply the rules to the results themselves.

Regardless of whether the saved-rules functionality is used or not, an answer set can contain one or several components. Once the system returns the answer set (Step 135), the engineer can consider each of the possible components in the answer set. In some embodiments, the engineer may need to choose exactly one of the components from the answer set to be the candidate component for that block. In other embodiments, the engineer can do one of three things: (1) choose a single candidate component from the answer set 155 so that the design can be updated with the chosen component 145; (2) defer the decision and retain the entire answer set as the candidate list 160 or future consideration; or (3) based on further research, choose several candidate components from the answer set while rejecting others from the answer set 155. If there is just one element in the answer set, the system may be configured to automatically assign it to the candidate list and then update the block diagram (see steps 155, 160, 140, and 145). If the component is itself a subsystem or subsystem, then the component's entire subsystem diagram can be inserted in the original block's position at step 145.

Figure 3B:
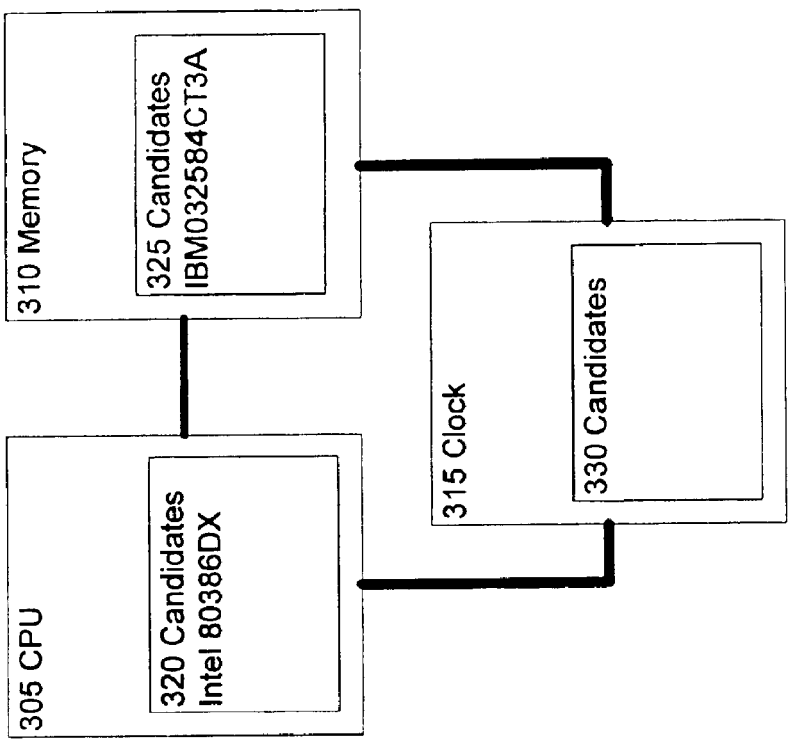
FIG. 3B is a block diagram of the system from FIG. 3B, but where the prime candidates have been chosen for two of the blocks.
Figure 3A:
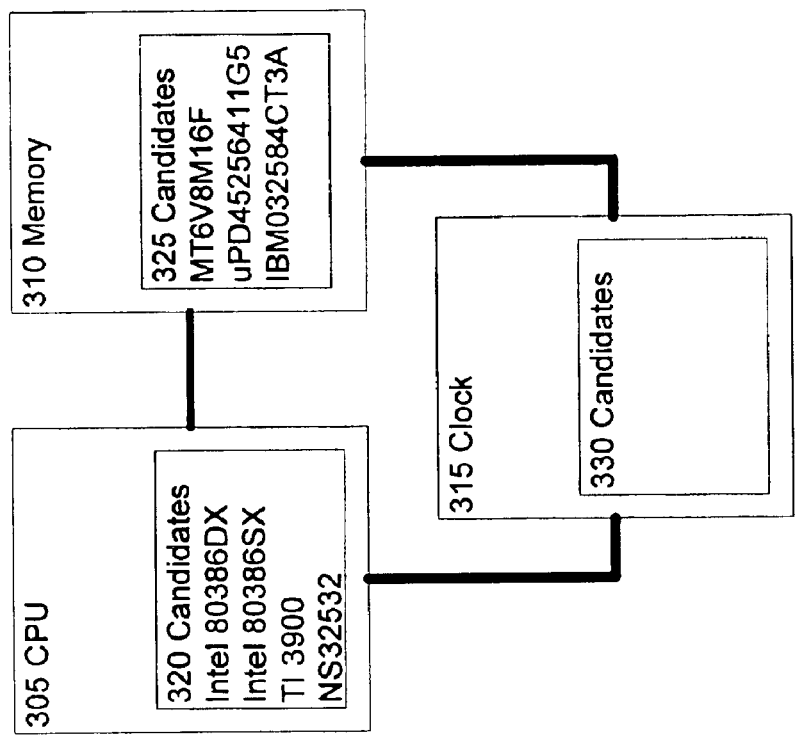
FIG. 3A is a block diagram of a system containing three blocks: a CPU, a memory, and a clock, where candidates lists have been found for two of the blocks.

FIG. 3A is a block diagram of the CPU/Memory/Clock design. The diagram has three interconnected component blocks: CPU 305 , Memory 310 , and Clock 315. For each block of the design, the candidate components can be assigned (see 320, 325 , and 330). In FIG. 3, candidate lists are populated for CPU (see 320) and Memory (see 325). The Clock component has not yet been processed. When the engineer submitted the query to find potential CPU products, a list of perhaps ten products may have been returned as the answer set. These ten products may be a combination of components and subsystems. From the ten, four potential products have been assigned to CPU 305 as potential choices: Intel's 386DX chip, Intel's 386SX chip, a chip from Texas Instruments, as well as the NS32532 chip. On the other hand, suppose the engineer's query for Memory products returned three products in the answer set. In FIG. 3A, the engineer may have decided to simply assign the entire answer set as potential candidates for the Memory component 310. Thus, three candidates have been assigned. The engineer can choose to pare down this candidate list at a later time in order to further refine the system design.

This steps of refining the blocks in the diagram by submitting queries and choosing candidates from the answer sets can be repeated as necessary (step 150) throughout the discovery process.

Some embodiments of the computerized Discovery tool described herein also include an system-constraint-based selection (step 165). At any point after the engineer has processed at least two of the blocks in the diagram, the engineer may perform this system-constraint-based selection, which checks the compatibility of the various blocks as well as verifying which set of products, when used as the components, will best meet a set of system-constraints.

Returning to CPU/memory/clock example, the engineer may be faced with designing a simple computer that can be produced for less than $205. The system-constraint-based selection process retrieves the candidate list for each of the blocks. The system-constraint-based selection process combines the various candidate lists in every potential combination. For example, suppose the block design has had an additional block added (for an I/O device). Now there are four blocks in the design. Also suppose that I/O block has been processed by the engineer and a candidate list assigned. However, the Clock block 315 remains with an empty candidate list. For ease of description, suppose the CPU block 305 has been assigned the candidate list of components A, B, and C; the memory block has a candidate list of D and E; and the I/O block has a candidate list of F and G. The system-constraint-based selection process will investigate the 12 combinations of components from the three blocks: ADF, BDF, CDF, AEF, BEF, CEF, ADG, BDG, CDG, AEG, BEG, and CEG. Now suppose the components have the following costs:

| Block | Component Candidate | Cost per Unit |
|---|---|---|
| CPU | A | $100 |
| CPU | B | $150 |
| CPU | C | $80 |
| Memory | D | $50 |
| Memory | E | $75 |
| I/O | F | $10 |
| I/O | G | $25 |
| Clock | <unknown> | <unknown> |

The system-constraint-based selection process (step 165) will perform the following calculations:

| Combination Checked | Total Cost | Meets $205 Requirement? |
|---|---|---|
| ADF | $100 + $50 + $10 = $160 | yes |
| BDF | $150 + $50 + $10 = $210 | no |
| CDF | $80 + $50 + $10 = $140 | yes |
| AEF | $100 + $75 + $10 = $185 | yes |
| BEF | $150 + $75 + $10 = $235 | no |
| CEF | $80 + $75 + $10 = $165 | yes |
| ADG | $100 + 450 + $25 = $175 | yes |
| BDG | $150 + 450 + $25 = $225 | no |
| CDG | $80 + $50 + $25 = $155 | yes |
| AEG | $100 + 475 + $25 = $200 | yes |
| BEG | $150 + $75 + $25 = $250 | no |
| CEG | $80 + $75 + $25 = $180 | yes |

Based on the $205 maximum cost requirement, four of the combinations of products exceed the total cost, but eight of the combinations remain as the set of prime candidate combinations. Knowing this, the engineer can investigate components for the Clock block, knowing that if the component costs more than $65, the design will not currently be able to be produced for less than the requisite $205 (because the CDF combination will cost $140).

Notice that in this example, each component or subsystem has a characteristic (price) which cumulatively contributes to the total system price. Total system price is a constraint against which this design is tested for compliance.

Of course, this example is quite simple. In reality, an engineer has many more system-wide requirements to be concerned with, including perhaps total power required, pin requirements, etc. The system-constraint-based selection process can be performed against multiple requirements so that the resulting set of prime candidates meet all necessary requirements.

FIG. 4 is a flow chart of implementing one embodiment of the system-constraint-based selection process. Following this flow chart, the candidate lists for each block to be checked is gathered (405). Combinations of these candidates are made (410). Although in the above example all possible combinations were made, it is foreseeable that a system might be configured to limit the number of combinations. Once the combinations are determined, the set of criteria is loaded (415). For each of the combinations to be checked, the combination is verified against the criteria (425) and if successful, is marked as an optimal combination (435). After all combinations are processed, the list of optimal combinations is returned (445).

Figure 2:
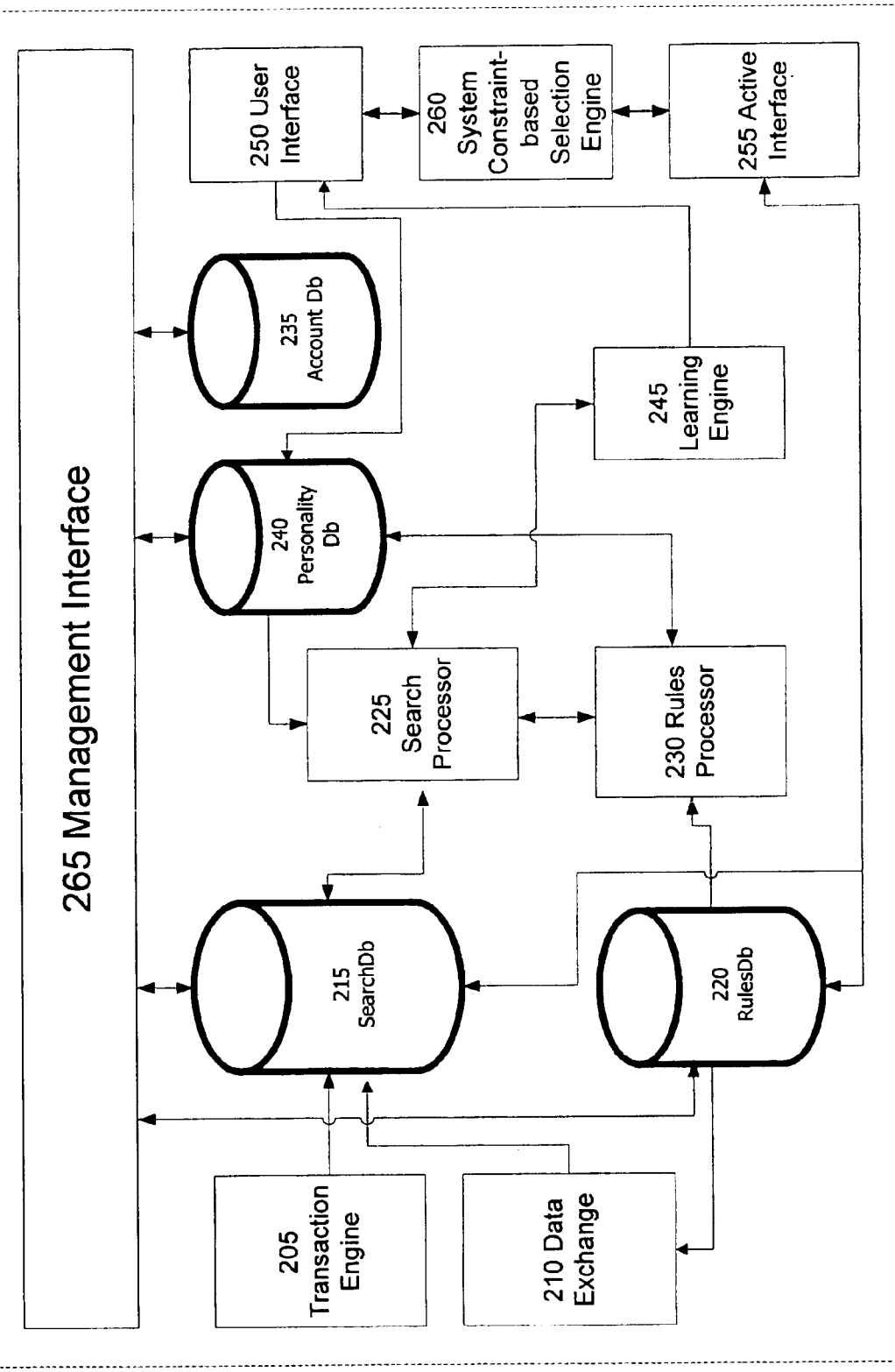
FIG. 2 is a block diagram for one embodiment of a computerized discovery tool in accordance with the invention.

Referring now to FIG. 2, a block diagram for a computerized discovery tool 200 which automates parts of the method described in FIG. 1 is shown. The discovery tool 200 is made up of several modules and databases that are interconnected via one or more computer networks. Preferably one of the computer networks is the Internet so that the system can be devised in a client/server fashion, with the server residing centrally and users accessing the system through personal computer acting as the clients. Although the discovery tool has been explained in much detail through the incorporated provisional applications, the modules will be generally described below. Of course, FIG. 2 is just one embodiment of a computer system that can utilize the method shown in FIG. 1. Not all of the modules in FIG. 2 are required. One skilled in the art could build a similar system based on just some of the modules.

User Interface 250

Discovery tool 200 includes a user interface 250 on a user's computer, which allows the user to interact with the functionality of the discovery tool 200. The user interface 250 allows the user to search for various components and designs, to build interpretive rules, and to validate a design through the compatibility checking function. The user interface 250 can be substantiated as set of Active Server Pages ("ASPs", HTML pages and graphics that access the various C++ objects of the rest of the system.

Search Database 215

The search database 215 stores all product and design related objects, including systems, subsystems, microsystems, components, products, vendors, and other sub-units. In one embodiment, the search database 215 is an Oracle database on an NT server.

Rules Database 220

The rules database 220 is a database that stores all system-wide rules for the discovery tool 200. In one embodiment, the rules are stored in text form to be later parsed by the rules processor.

Rules Processor 230

The Rules Processor 230 applies the rules that are in the rules database 220 on the objects and attributes in the system. The rules processor 230 is a set of VC++ objects that depend on the rules database 220 to hold rule definitions in string and pre-processed format. The rules processor 230 can evaluate mathematical expressions that can comprise of variables, arithmetic (+, −,*, /), relational (>,>=, <,<=, =, !=) and logical (AND, OR) operators. It supports use of brackets to affect precedence. It supports four functions Min{value1, value2}, Max{value1, value2}, Exs{value1, value2}, Rnd{value1, value2} that take two parameters and evaluate to the maximum, minimum, absolute difference and rounded off value respectively.

A rule that needs to be evaluated is first parsed by the rules processor 230 to identify the variables used. The client using the rules processor 230 needs to provide values for all these variables before evaluating it. The rules processor 230 evaluates the expression (such as from a search criteria statement) in the following steps:

(1) Variables used in the expression are identified.
(2) All the variables in the expression are replaced with the values provided with by the client.
(3) All brackets that affect the precedence of the logical operators are replaced with a different set of brackets to distinguish them from those that affect the arithmetic operators precedence.
(4) The expression is parsed and converted to postfix notation, each token in this notation being either an arithmetic expression that contains only arithmetic operators or logical operators that combine the individual arithmetic expressions.
(5) Each token in this postfix notation has one arithmetic expression that does not have any logical operators. These expressions are again parsed and converted to postfix notation, this time, each token in this notation being a variable or constant, or arithmetic operators used. The result of this evaluation will give the value of the arithmetic expression, which will be used as the value of the tokens obtained in the previous step.
(6) The result of the evaluation of the tokens in the postfix notation is the result of the expression and is returned to the client.

Search Processor 225

To facilitate searching of the databases (215 & 220), the discovery tool 200 uses a specialized search processor 225 which generates the unformatted output for every search criteria statement, applying user-level information and system-level rules to the search criteria statement before delivering the results to the learning engine 245 (if implemented). The search processor 225 supports three types of searches: rule-based searches, structured searches, and keyword searches. First, rule-based searches allow the engineer-user to build the search criteria statement as a complex query to be executed by the search processor 225. The syntax available for the search criteria statements has been designed to be intuitive and especially useful to engineers.

For example, suppose an engineer who has already designed an RF amplifier's first stage for low noise figure now needs to choose components for the second stage. The engineer could construct and execute the rule-based search to perform the following: "IF the first stage noise figure PLUS the second stage noise figure DIVIDED by the first stage gain is LESS THAN 3 dB THEN select the second stage with MAX gain or ELSE select MIN noise figure." In such a search, the rules processor 230 is invoked by the search processor 225 and the search criteria statement is parsed and the operands used are identified. An SQL Query is built to fetch the values for those operands for all the component instances, and for each part, the values of the operands are given for evaluation. If the expression evaluates to "TRUE" then that component is added to the results list. If a component has multiple values for an attribute, then all possible combinations of the values of the attributes is first computed, and then all those combinations are used to evaluate the rule, and if any one of the combinations satisfies the rule, the component is added to the results list. The results of each of these parts are either combined or the intersection of the results is used based on the logical operator between the directives.

The second type of search, the Structured Search, navigates the user through the data hierarchy. For example, the user could request to see memory unit components. The user would then be presented with the choice of traversing RAM, ROM, FLASH, or other types of memory. Upon choosing on of these categories, the user could proceed through other subcategories of memory.

The third type of search, Keyword Searching, is self-explanatory. This search allows the user to find all components whose supporting data contains a given word or string. The Keyword Search is performed by building an SQL Query based on the keywords entered. The SQL query uses the LIKE clause to check the presence of the keywords in a predefined set of searchable attributes of components and reference designs. The wildcard support of SQL Server in the LIKE clause is used to implement he wild cards supported by the discovery tool 200.

The discovery tool's search processor 225 addresses the problems common to other search engines of returning either too many or too few results. The rule-based searches, which allow complex search criteria statements to be constructed, solve the "too many results" problem. The "too few results" problem is solved by the implementation of an "instant response" feature. The Instant Response feature provides immediate feedback on the number of hits that will be returned by the current search. By seeing the Instant Response number, the user can adjust the search parameters to arrive at a search that will return a more adequate number of hits.

At a functional level, the search processor 225 operates in the following sequence:

(1) It receives the search criteria statement and applies user-level interpretive rules to it, to ensure that the result-set is as close as possible to the user's search preferences;
(2) It applies system-level interpretive rules to the search criteria statement, to establish the learned knowledge of the discovery tool system in terms of equivalencies and the like;
(3) It creates the answer set from the search database 215, based on the query generated from the above steps;
(4) It invokes the rules processor 230 on the result-set and the query, to apply design-level rules on them. This may result in a larger or smaller result set, depending on the rules in the rules database 220.
(5) It passes the result-set on to the learning engine 245, for presentation to the user interface 250.

System-Constraint-based Selection Engine 260

The discovery tool 200 also provides a system-constraint-based selection module 260. The system-constraint-based selection module 260 can verify that component candidates for several blocks are compatible, or it can determine which of the combination of component candidates are optimal. This module is especially useful as a final verification step to ensure that all selected objects/components meet project requirements.

Management Interface 265

The management interface 265 is used by a system administrator to manage user IDs, track usage statistics, manage the promotion of user-specific rules to system-wide rules, provide reporting, etc. In one embodiment, the management interface 265 is a set of ASPs.

Data Exchange 210 (Input Data Processor and Rules Exchange)

The Data Exchange module 210 loads data into the databases. The data exchange 210 includes two parts-the Input Data Processor and the Rules Exchange. The input data processor is a software utility that imports component specifications into the search database 215, based on initial directives and interpretive rules in the rules database 220. The input data processor is a client/server program, written in Visual Basic and VC++, that runs as an independent utility used by a system administrator. The rules exchange is a set of VC++ routines that are built to interact with specific third-party software systems. It runs both as a stand-alone utility and as an interface initiated from the user environment.

The input data processor 210 ensures that all available data is uploaded into search database 215 before the discovery tool 200 begins working for designers. On an ongoing basis, though, Applicant expects to receive data updates from vendors, customers and partners about product availability, changes in specifications, financial transactions for memberships and, in future, purchase transactions. Product data (data books, reference designs and application notes) is available from manufacturers on CD ROMS. The Input Data Processor accepts data sheets in file format (HTML and PDF) and stores them in the Search Database 215. Information unavailable in electronic form is entered manually.

The Input Data Processor performs the following method:
1. Begins with a set of identification directives that the user provides, at start-up. These directives specify, for example, the part of the input documents that has the name of a component and the name of the product.
2. Reads in the input HTML and PDF documents.
3. Identifies tables, fonts, repetitive strings and other such patterns in the input and applies the start-up directives to identify component names and product names.
4. Splits these patterns into attributes and values of products.
5. Recognizes components among the products, based on the start-up directives.
6. Applies relevant interpretive rules from the rules database 220 on the input.
7. Looks for the components in the search database 215 and, if not found, creates them.
8. Creates the products that the input documents depict, with attributes and values.
9. Records a log of the components and products created and the rules used.

In the current implementation of the Input Data Processor, some additional functionality includes:

It uses security to allow only specific users to run the Input Data Processor.

It reads, manipulates and processes HTML and PDF files equally well.

It recognizes patterns in the input documents as parts of tabular structures or via font standards.

It takes, as secondary input, a set of directives (parameters) either from a screen or from a configuration file. These directives include visually identified factors that the Input Data Processor can use to increase its effectiveness. For example, a configuration parameter could be the location of the product name, as a string of the form "Product:" in a specific font.

It recognizes multiple "levels" of attributes, like a table for a given attribute, as sub-attributes of a product.

It records all processed input in a "holding" database.

It records unidentified strings with automatically generated attribute-names that can later be manually modified.

It records a detailed log in a structured table that includes component name, product name, attribute processed, etc. The log includes summary information about each product that is processed, each "run" of the Input Data Processor and details of the user who invoked it and the time it ran (from and to).

It includes an interface that helps users move "cleared" products and components from the holding database to the search database 215.

Web Crawler

The web crawler works as part of the data exchange 110. In order to automate the process of collecting data for the search database 215, a Web Crawler can be implemented as part of the Discovery tool 200. The Web Crawler has the following functionality:

Store retrieved documents in a hierarchical tree mirroring the structure of the site as determined by pattern matching of links followed and text in their immediate context.

Start exploration and retrieval from a configuration file of sites and exploration parameters, and process least recently explored sites first (so that the process can be prematurely ended but eventually explore all the sites in the configuration file)

Store documents specified by exploration parameters as files, each with an associated text file description (containing URL, hierarchy path (site base path + hierarchy within that site), manufacturer, modified date, downloaded date)

Log and/or interactively display download activity

Output a text stream of filenames of new/updated documents

Retrieve documents over anonymous http and ftp

Don't re-download content if it is certain by modification date that it has not changed Don't re-visit pages (prevent infinite loops), restrict crawling to fixed depth or to within a set of base URLs Documented plain-text configuration files Persistent information is not corrupted by unexpected program termination In one implementation of the web crawler, the web crawler performs the following process:

1) Clear job queue and visited URL set
2) Record program start time
3) If job queue is empty, find the site file with the oldest access time:
   a) If access time is later than program start time, end program
   b) Load manufacturer name
   c) Add URL/starting path to job queue with depth 0
   d) Load all the link exploration rules for that resource and append them into one rule list
   e) Load authentication information
   f) Load depth limit
4) While job queue is not empty:
   a) Pull first item from queue
   b) Get modification time of document referenced by URL (using current resource authentication info); if failed, log error and restart loop (goto 3)
   c) Retrieve the document content of the URL (using current resource authentication info)
   d) Convert document to normalized HTML
   e) For each exploration rule, match the regular expression against the normalized HTML; for each matching rule/context found:

i) If matched link is on visited list, continue on next match
ii) Add matched link to visited list
iii) Concatentate directory onto current path
iv) If rule is terminal, and modification time of the linked document is not equal to the existing local copy of that document, retrieve it preserving modification time, and save it under path
v) If rule is nonterminal, the link matches base URL of current resource, the content type is HTML, and depth is not greater than the site's limit, then add job with new url/path, and depth+1

5) Go to step 3

Transaction Engine 205

The Transaction Engine 205 is a common platform for the transfer of these types of transactions, operating securely and with speed. It is built as a set of VC++ objects running on an NT server, with Microsoft's Site Server Commerce Edition ("SSCE" and Microsoft's transaction management platform. SSCE is integrated into the discovery tool environment to handle data and sales transactions through the SSCE Commerce Interchange Pipeline ("CIP". Specific transaction classes provide interaction with partners and vendors for data updates.

Learning Engine 245

The Learning Engine 245 is an automatic feedback mechanism that tracks usage, learns user preferences from them and applies these preferences to some parts of the discover tool system 200, making them more applicable to the specific user. These preferences may range from simple things like color and layout preferences to more value-add items like preferred search parameters, design constraints applicable during a project, vendor preferences and lead-time requirements for manufacturing. The learning engine 245 picks up all output from the other modules in the system and massages it before presentation, to fit the preferences that it learns by looking through the user-interaction history that is stored in the Personality Database 240. This module is a set of VC++ objects that work on the HTML or ASP pages from other modules (mostly the user interface 250).

The learning engine 245 can be a custom piece of software that applies to specific parts of the user interface 250. For example, one routine in the learning engine 245 can apply specifically to the page that displays the results of a structured search, ordering the output in a user-specific set of frames and colors. As the discovery tool system 200 develops in functionality, more complexity can be added to the learning engine 245, making it more generic and more intelligent.

Personality Database 240

The personality database 240 stores user-specific information, including demographic data, user preferences, common typographical errors made by the user, user-designed rules, etc. The personality database 240 may also store logs of all of the user's actions for future use. The personality database 240 can include a combination of ASPs that form data into a series of database tables.

Active Interface 255

The Active Interface 255 is an Active-X application that enables a richer, more visual user experience that with pure HTML and scripted pages. Most of the discovery tool system 200 interfaces can be designed in HTML. The active interface 255 is only necessary in some specific cases, including:

(1) Building an object hierarchy of systems, subsystems and components to reflect the true design of a product;
(2) Defining rules in a programmatic language via a context-sensitive editing mechanism that recognizes both the list of available operators and the wealth of objects and attributes in the search database 215; and
(3) Rendering the object hierarchy and object relationships into user-created block-diagrams, using the contents of the search database 215, the rules database 220 and a specific cache of visual positioning directives.

The active interface 255 invokes the rules processor 230 where necessary, to retrieve or copy rules between the rules database 220 and third-party diagramming packages, thereby providing a seamless visual experience for the user.

Short Example Walkthrough

Referring to FIG. 2, the interconnections of the discovery tool 200 can be described by walking through an example of a user executing a search request. First, the user creates the search query. The query can be modified by: (1) filters, such as "not including"; (2) references to specific constraints to attributes of specific objects (such as "SLIC package-width not >5 mm"; (3) references to already existing user rules; or (4) processing options (such as "apply rules on request").

The user interface 250 stores a log of the query request to the personality database 240, then the query is passed to the search processor 225. The search processor 225 invokes the rules processor 230 to apply the user-level interpretive rules in order to modify the query. Then, the search processor 225 sends the query to the search database 215 to form the preliminary answer set. The search processor 225 then invokes the rules processor 230 a second time to run the system-wide rules against the preliminary answer set. The finalized answer set is passed to the learning engine 245, which applies any user-preferred formatting (found in the personality database 240). The formatted answer set is passed to the user interface 250 and displayed to the user as a HTML page.

Dataflow Diagrams

FIGS. 5A through 5E are dataflow diagrams which describe the Discovery Tool embodiment of FIG. 2. As is well known in the art, a dataflow diagram consists of external entities (represented by rectangles), processes (represented by ellipses), data stores (represented by two parallel lines), and dataflows (represented by arrows). Dataflow diagrams allow a system to be described by showing the transformations (i.e., processing) of certain inputs into outputs (i.e., data), indicating where data stores may need to be consulted or updated. One skilled in the art will also understand the numbering format of FIGS. 5A through 5A. Top level processes are labeled with a whole number (such as 9.0 for the Rules Processor). When a process is exploded in a lower level dataflow diagram, the processes in the lower level diagram are consecutively numbered following the decimal point (such as 9.1 for a subprocess within the Rules Processor). The following tables list the various elements included in FIGS. 5A through 5E:

| Main 0.0 | |
|---|---|
| Element | Description |
| System-Constraint-Based Selection requests | List of references to stored system-constraint-based selection rules |
| Circuit designs | Tree structures that group references to components |
| Compatible component lists | List of references to components that satisfy the selected system-constraint-based selection rules. Also referred to as Prime Candidates |
| Component data | Resulting answer sets of components created through SQL queries |

-continued

Main 0.0

| Element | Description |
| --- | --- |
| Filtered component data | Resulting answer sets of components created through rule based searches |
| New component data | Component data either spidered from vendor sites or provided through asynchronous data transfer |
| Parsed rules | Tokenized stacks of atomic search parameters |
| Personalization data rules | Weight lists for prioritization of rules based on previous usage |
| Search requests | List of references to stored search rules |
| Usage patterns | Ordered lists of user rule selections |
| User input | List of selected rules |

Search Processor 8.0

| Element | Description |
| --- | --- |
| Category context | Restrictions on search space based on selected categories |
| DB requests | SQL data queries |
| DB results | Result sets of component references from the database |
| Filtered result lists | Final result sets of component references from the database |
| Personalization data | Weight lists for prioritization of rules based on previous usage |
| Rule requests | Rule selections |
| Rules | Lists of references to stored rules |
| Search requests | Lists of ad hoc search rules |
| Tokenized lists | Tokenized stacks of atomic search parameters |

Rules Processor 9.0

| Element | Description |
| --- | --- |
| Atomic rules | Tokenized atomic search parameters |
| Parsed rules | Tokenized stacks of atomic search parameters |
| Rule requests | Rule selections |
| Rules | Lists of references to stored rules |
| Search requests | Lists of ad hoc search rules |

System-Constraint-based Selection Engine 14.0

| Element | Description |
| --- | --- |
| System-constraint-based selection requests | List of references to stored system-constraint-based selection rules |
| Category context | Restrictions on search space based on selected categories |
| Compatible component lists | List of references to components that satisfy the selected system-constraint-based selection rules |
| DB requests | SQL database queries |
| Personalization data | Weight lists for prioritization of rules based on previous usage |
| Rules | Lists of references to stored rules |
| Tokenized lists | Tokenized stacks of atomic search parameters |

Active Interface 12.0

| Element | Description |
| --- | --- |
| System-constraint-based selection requests | List of references to stored system-constraint-based selection rules |
| Circuit designs | Tree structures that group references to components |
| Compatible component lists | List of references to components that satisfy the selected system-constraint-based selection rules. Also referred to as the Prime Candidate combinations. |
| Design requests | Single design selections |
| Filtered component data | Resulting answer sets of components created through rule based searches |
| Filtered result lists | Final result sets of component references from the database |
| Saved designs | Tree structures that group references to components |

Site Architecture

This section describes the major components of software and hardware that goes into building a website as one embodiment of the discovery system 200. The site is hosted externally, on servers owned by a high-end web hosting company. Most of the "systems software" that is needed to keep the site up and running full time is included as part of the hosting service such companies.

Figure 6:
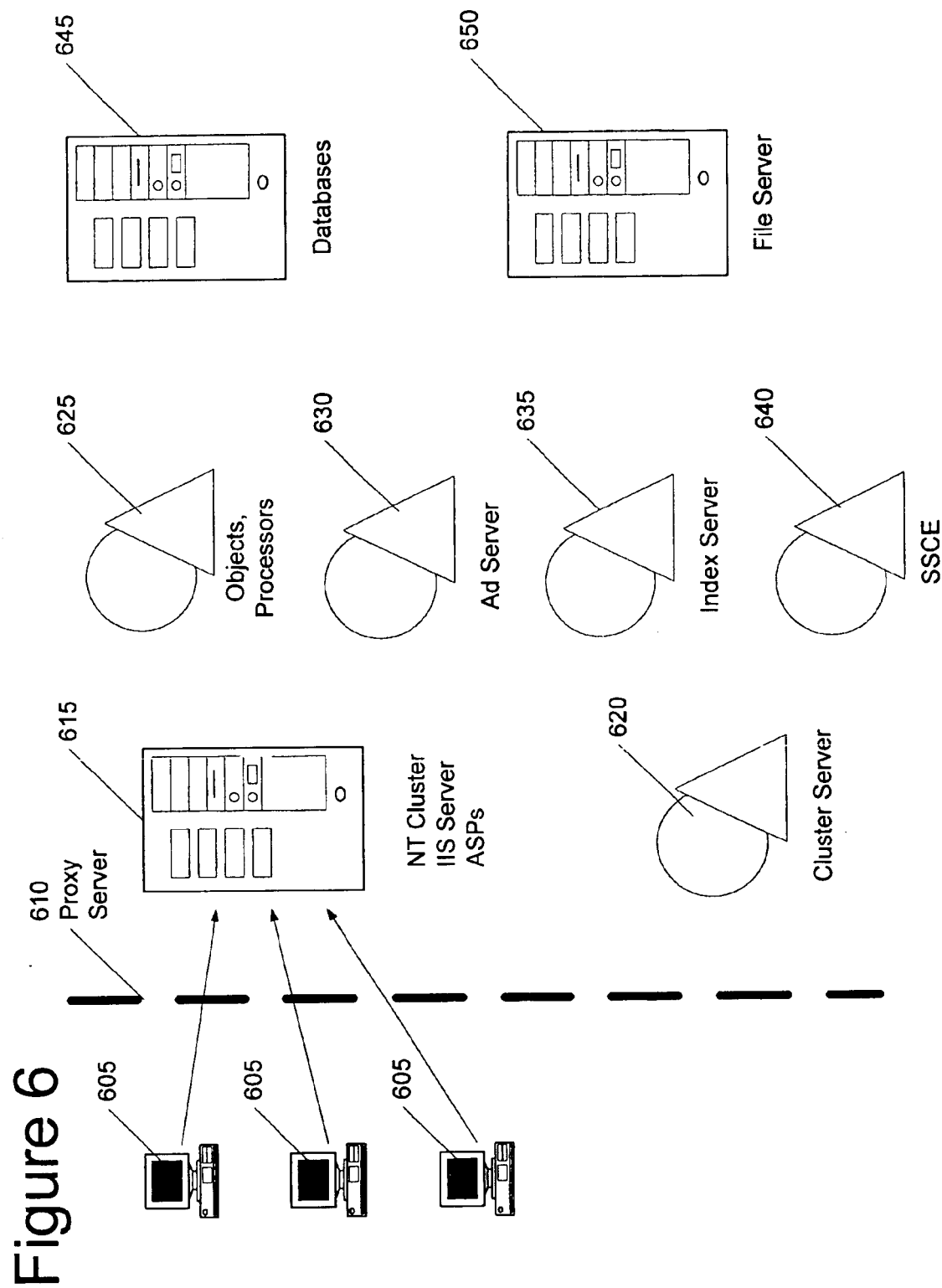
FIG. 6 is a block diagram of one embodiment of the technical architecture of a computerized discovery tool in accordance with the invention.

The site runs on a cluster of NT machines that run IIS 4.0. FIG. 6 is a diagrammatic representation of all the software components in the site and a brief description of each component's role. FIG. 6 represents the various software components that go to make the Discovery Tool 200 environment. Below is a brief description of each component, in terms of its role in the Discovery tool environment and its availability from one possible hosting company.

Microsoft IIS 4.0 (615): This is the Web server software that reacts to all user interaction from across the Web and delivers the HTML pages to the user's browse. It includes a scripting engine that processes ASP code on the server. These pages are mostly the User Interface 250 and Learning Engine 245 parts of the Discovery Tool 200 environment. This component is standard-issue on servers that web-hosting companies provide.

Discovery Tool Objects (625): These are the VC++-built objects of the Discovery Tool 200 environment and they include parts of the Search Processor 225, Rules Processor 230, Learning Engine 245 and Transaction Engine 205.

Microsoft Ad Server (630): This manages the selection and delivery of the targeted ads that some site pages display, ensuring proper repeat displays and recording display counts, click-through counts, etc.

Microsoft Index Server (635): The Index Server indexes textual information and provides a search mechanism, equivalent to a normal search engine.

Microsoft Transaction Server (MTS): MTS manages the creation and destruction of Discovery Tool objects in an efficient manner.

Microsoft Cluster Server (MSCS): MSCS "clusters" multiple server machines into one large fail-safe group, thereby providing round the clock access to the website. High-end hosting companies normally provide this (or an equivalent mechanism) as a part of the service.

Microsoft Proxy Server (610): A Proxy Server is standard in most web-hosting companies.

Microsoft SSCE (640): SSCE is normally provided as part of the environment by hosting companies.

Microsoft SQLServer: The SQLServer database is available from most hosting companies and will hold all of the Discovery Tool's data.

Although the present application has described the invention as being embodied in a Discovery tool for engineers, it will be recognized by one skilled in the art that the invention is not limited only for use in the Discovery phase of product development. The invention could be used for any application in which a system is conceptualized and later refined and checked for compatibility or for meeting a set of criteria For example, such an invention could be used as part of software development or software support because software systems contain functions or modules which can be refined over time. The present invention could be used in other industries as well, the automotive industry being just one example. Although the invention is shown assisting a block diagram design of a system, the invention also can be applied to systems that are conceptualized with other methods. For example, rather than being displayed as a series of interconnected blocks, a system could also be described as a list of elements. In more advanced imaging systems, the design elements might even be displayed in their actual 3D shape rather than as just a 2D block. For example, a computer system for automotive design might be able to display the conceptual design for a new engine with the shapes of the cylinders, pistons, and other component s interconnected.

From the foregoing detailed description, it will be evident that there are a number of changes, adaptations and modifications of the present invention which come within the province of those skilled in the art. However, it is intended that all such variations not departing from the spirit of the invention be considered as within the scope thereof.

What is claimed is:

1. A method for finding in a larger system, components or subsystems that meet a predefined set of requirements, through the use of rule-based searches and block diagrams, the method comprising:
   selecting a first block from a block design of a system, where the block design comprises a plurality of blocks, each block representing a component or subsystem of the block design;
   submitting a search query to a database of objects for researching which component or subsystem to use for the first block;
   receiving an answer set from the database of objects that satisfies the search query, where the answer set comprises at least one object from the database of objects;
   assigning at least one candidate object from the answer set to the first block in the block design; and
   repeating the steps of selecting, submitting, receiving, and assigning for at least one other block in the block design.

2. The method for finding in a larger system, components or subsystems that meet a predefined set of requirements from claim 1, wherein the step of assigning is automatic if the answer set contains exactly one object.

3. The method for finding In a larger system, components or subsystems that meet a predefined set of requirements from claim 1, wherein the step of repeating is repeated for all remaining blocks in the block design.

4. The method for finding in a larger system, components or subsystems that meet a predefined set of requirements from claim 1, wherein the step of assigning comprises:
   associating a candidate object from the answer set to the first block in the block design; and
   updating the block design by replacing the first block with a representation of the candidate object.

5. The method for finding in a larger system, components or subsystems the that meet a predefined set of requirements from claim 1, wherein the database of objects comprises engineering designs and engineering components.

6. The method for finding in a larger system, components or subsystems that meet a predefined set of requirements from claim 1, wherein the database of objects comprises technical papers.

7. The method for finding in a larger system, components or subsystems that meet a predefined set of requirements from claim 1, wherein the database of objects comprises patent documents.

8. The method for finding in a larger system, components or subsystems that meet a predefined set of requirements from claim 1, wherein the database of objects comprises software modules.

9. A method for finding in a larger system, components or subsystems that meet a predefined set of requirements, through the use of rule-based searches and block diagrams comprising:
   selecting a first generic description from a system design, where the system design comprises a plurality of generic descriptions, each generic description representing a component or subsystem of the system design;
   submitting a search query to a database of objects for researching which component or subsystem to use for the first generic description;
   receiving an answer set from the database of objects that satisfies the search query, where the answer set comprises at least one object from the database of objects;
   assigning at least one candidate object from the answer set to the first generic description in the system design; and
   repeating the steps of selecting, submitting, receiving, and assigning for at least one other generic description in the system design.

10. The method for finding in a larger system, components or subsystems that meet a predefined set of requirements from claim 9, wherein the step of assigning is automatic if the answer set contains exactly one object.

11. The method for finding in a larger system, components or subsystems that meet a predefined set of requirements from claim 9, wherein the step of repeating is repeated for all remaining blocks in the block design.

12. The method for finding in a larger system, components or subsystems that meet a predefined set of requirements from claim 9, wherein the step of assigning comprises:
   associating a candidate object from the answer set to the first block in the block design; and
   updating the block design by replacing the first block with a representation of the candidate object.

13. The method for finding in a larger system, components or subsystems that meet a predefined set of requirements from claim 9, wherein the database of objects comprises engineering designs and engineering components.

14. The method for finding in a larger system, components or subsystems that meet a predefined set of requirements from claim 9, wherein the database of object comprises technical papers.

15. The method for finding in a larger system, components or subsystems that meet a predefined set of requirements from claim 9, wherein the database of objects comprises patent documents.

16. The method for finding in a larger system, components or subsystems that meet a predefined set of requirements from claim 9, wherein the database of objects comprises software modules.

17. A rule-based refinement tool, for finding in a larger system, components or subsystems that meet a predefined set of requirements, through the use of rule-based searches and block diagrams, comprising:
- a database of objects, wherein the objects are related to components or subsystems;
- a search engine which accepts a search query and executes the search query against the database of objects to determine which components or subsystems can be used for a generic description portion of a system design, which returns an answer set of at least one candidate object; and
- an assignment processor for assigning at least one candidate object from the answer set to the generic description In the system design.

18. The rule-based refinement tool from claim 17, further comprising a drawing module which graphically presents the generic descriptions of the system design as a series of blocks interconnected to form a block diagram.

19. The rule-based refinement tool from claim 18, further wherein the assignment processor instructs the drawing module to graphically replace the generic description with the candidate object.

* * * * *